United States Patent
Verhaverbeke

(10) Patent No.: US 7,767,586 B2
(45) Date of Patent: *Aug. 3, 2010

(54) METHODS FOR FORMING CONNECTIVE ELEMENTS ON INTEGRATED CIRCUITS FOR PACKAGING APPLICATIONS

(75) Inventor: Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

This patent is subject to a terminal disclaimer.

(21) Appl. No.: 12/037,248

(22) Filed: Feb. 26, 2008

(65) Prior Publication Data

US 2009/0111259 A1  Apr. 30, 2009

Related U.S. Application Data

(63) Continuation-in-part of application No. 11/927,266, filed on Oct. 29, 2007.

(51) Int. Cl.
*H01L 21/302* (2006.01)

(52) U.S. Cl. ............... 438/725; 438/613; 438/745; 438/694; 134/2; 257/E21.585

(58) Field of Classification Search ........... 438/613, 438/725; 257/E25.585
See application file for complete search history.

(56) References Cited

U.S. PATENT DOCUMENTS

| | | | |
|---|---|---|---|
| 5,024,372 A * | 6/1991 | Altman et al. | 228/180.22 |
| 5,464,480 A | 11/1995 | Matthews et al. | |
| 5,632,847 A | 5/1997 | Ohno et al. | |
| 5,690,747 A | 11/1997 | Doscher | |
| 5,803,340 A * | 9/1998 | Yeh et al. | 228/56.3 |
| 6,053,397 A * | 4/2000 | Kaminski | 228/254 |
| 6,080,531 A | 6/2000 | Carter et al. | |
| 6,232,212 B1 * | 5/2001 | Degani et al. | 438/612 |
| 6,551,409 B1 | 4/2003 | DeGendt et al. | |
| 6,674,054 B2 | 1/2004 | Boyers et al. | |
| 6,696,228 B2 | 2/2004 | Muraoka et al. | |
| 6,699,330 B1 | 3/2004 | Muraoka | |

(Continued)

FOREIGN PATENT DOCUMENTS

EP  0867924 A2  9/1998

(Continued)

OTHER PUBLICATIONS

Ohmi, T. et al., "Native Oxide Growth and Organic Impurity Removal on Si Surface with Ozone-Injected Ultrapure Water," J. Electrochem. Soc., vol. 140, No. 3, Mar. 1993, pp. 804-810.

*Primary Examiner*—Davienne Monbleau
*Assistant Examiner*—Allen L Parker
(74) *Attorney, Agent, or Firm*—Moser IP Law Group

(57) ABSTRACT

Methods for forming connective elements on integrated circuits for packaging applications are provided herein. In some embodiments, a method of forming connective elements on an integrated circuit for flipchip packaging may include providing a resist layer on the integrated circuit; forming a plurality of holes through the resist layer; filling the plurality of holes with conductive material; and stripping at least a portion of the resist layer using a stripping solution containing acetic anhydride and ozone to expose the connective elements.

20 Claims, 2 Drawing Sheets

U.S. PATENT DOCUMENTS

| | | | |
|---|---|---|---|
| 7,402,213 B2 * | 7/2008 | Verhaverbeke | 134/40 |
| 2002/0066717 A1 | 6/2002 | Verhaverbeke et al. | |
| 2002/0086512 A1 * | 7/2002 | Min | 438/613 |
| 2002/0173134 A1 * | 11/2002 | Viswanadam et al. | 438/613 |
| 2002/0173156 A1 | 11/2002 | Yates et al. | |
| 2004/0082159 A1 * | 4/2004 | Shieh et al. | 438/612 |
| 2007/0181165 A1 | 8/2007 | Verhaverbeke | |

FOREIGN PATENT DOCUMENTS

| | | |
|---|---|---|
| JP | 61-004232 | 1/1986 |
| JP | 2002025971 | 1/2002 |

* cited by examiner

METHODS FOR FORMING CONNECTIVE ELEMENTS ON INTEGRATED CIRCUITS FOR PACKAGING APPLICATIONS

CROSS-REFERENCE TO RELATED APPLICATIONS

This application is a continuation-in-part of U.S. patent application Ser. No. 11/927,266, filed Oct. 29, 2007, by Steven Verhaverbeke, and entitled "WET PHOTORESIST STRIP FOR WAFER BUMPING WITH OZONATED ACETIC ANHYDRIDE," which application is related to U.S. patent application Ser. No. 11/347,516, filed Feb. 3, 2006, by Steven Verhaverbeke, entitled "STRIPPING AND REMOVAL OF ORGANIC-CONTAINING MATERIALS FROM ELECTRONIC DEVICE SUBSTRATE SURFACES," each of which is hereby incorporated by reference.

BACKGROUND

1. Field of the Invention

The invention relates generally to fabrication of electronic device structures, and more particularly, to methods and systems for forming connective elements on integrated circuits for packaging applications.

2. Brief Description of the Background Art

The information in this Background Art portion of the application is provided so that the reader of the application can better understand the invention which is described subsequently. The presence of the information in this Background Art portion of the application is not an admission that the information presented or that of combination of the information presented is prior art to the invention.

One common technique for connecting integrated circuits (ICs) to printed circuit boards is with the use of "flip-chips." In a flip chip, electrical circuits are formed on one side of the IC, and connective elements made of solder bumps (sometimes referred to as wafer bumps) are formed on a layer atop the electrical circuit. The IC is then placed, contact-side down, onto an interconnect, such as a multi-chip module, a land grid array (LGA), or ball grid array (BGA) substrate, so that the solder bumps are in firm contact with corresponding contacts disposed on the interconnect (for example, surface mount pads). The solder bumps may then be heated to melt the solder bumps and establish a solid electrical connection between the IC and the interconnect.

One method of forming solder bumps on ICs uses a patterned positive photoresist to mask the IC and define regions where solder is to be deposited (e.g., corresponding to locations where the solder bumps are desired). However, conventional positive photoresist materials are limited in the thickness to which they may be deposited. Accordingly, to deposit enough solder to form the desired solder bumps for typical applications, the solder must be overplated, thereby occupying a larger area on the upper surface of the positive photoresist. This overplating requirement limits the pitch at which the solder bumps may be formed, thereby limiting the usefulness of this technique where tighter pitches are desired.

For example, FIG. 4 depicts a substrate 402 having a plurality of wafer bumps 406 partially formed thereupon by use of a positive photoresist mask 404. The limited thickness of the positive photoresist mask 404 requires that the wafer bumps 406 be formed using an overplating process. For example, the positive photoresist mask 404 may be patterned to form a plurality of holes 408 corresponding to the locations where the wafer bumps 406 are to be formed on the substrate 402. The substrate 492 is then plated to fill the holes 408 and overplated (as indicated by 410) to form a mushroom-like shape that extends radially outwards from the holes 408 atop the surface of the positive photoresist mask 404. When the pitch (P) between the wafer bumps 406 is large, there is sufficient room for the overplating process to be performed. However, at smaller pitches, the overplated portions of the wafer bumps 406 may undesirably interfere with each other and join together (as shown at 412), thereby causing the process to fail.

With the advancement of technology, there is a growing need to further reduce the size of ICs. One of the major challenges in reducing IC size is reduction in dimensions of the components of the IC, including a corresponding reduction in the pitch of the solder bumps and contacts for mounting the IC to the interconnect. However, as discussed above, positive photoresist fabrication techniques present difficulties in attaining the desired small pitch size due to the overplating issue.

Negative photoresists, on the other hand, may be useful for the forming wafer bumps at tighter pitches. Specifically, negative photoresists may be deposited to greater thicknesses, thereby facilitating the deposition of larger volumes of solder without overplating. The elimination of the overplating requirement facilitates fabricating solder bumps having a tighter pitch. However, due to material limitations, negative photoresists are difficult to strip and typically have been used in applications where their removal is not required. As such, negative photoresists have generally not been utilized in solder bump formation applications.

Thus, there is a need for an improved method of forming connective elements for flipchip packaging.

SUMMARY

Methods for forming connective elements on integrated circuits for packaging applications are provided herein. In some embodiments, a method of forming connective elements on an integrated circuit for flipchip packaging may include providing a resist layer on the integrated circuit; forming a plurality of holes through the resist layer; filling the plurality of holes with conductive material; and stripping at least a portion of the resist layer using a stripping solution containing acetic anhydride and ozone to expose the connective elements.

In some embodiments, a method of forming connective elements on a substrate may include providing a substrate having a plurality of connective elements extending therefrom and further having a resist layer disposed on the substrate and partially surrounding the connective elements; and stripping at least a portion of the resist layer using a solution containing acetic anhydride and ozone to expose the connective elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
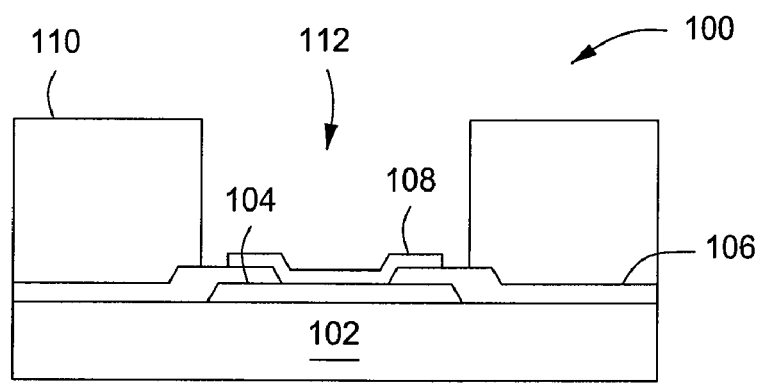
FIGS. 1A-D depict schematic cross sectional views of a wafer illustrating stages of an illustrative wafer bump formation process according to some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

As a preface to the detailed description presented below, it should be noted that, as used in this specification and the appended claims, the singular forms "a", "an", and "the" include plural referents, unless the context clearly dictates otherwise. The term "about", as used herein, refers to a value or range which may encompass at least plus or minus 10% of a particular cited value or range.

Embodiments of the present invention provide a connective element formation process suitable for fabricating connective elements for flipchip packaging at reduced pitches as compared to conventional techniques. Embodiments of the inventive connective element formation process may provide additional features and benefits as well, as described in more detail below. The connective element formation process generally includes exposure and developing of a photoresist structure on a substrate, filling up of hole patterns within the photoresist structure with a conductive material (for example, solder, such as a solder paste), forming conductive bumps from the conductive material (for example, such as by reflow of solder paste within the hole patterns), and stripping of the photoresist from the substrate (for example, as part of an IC, or chip 100, as illustratively depicted below in FIGS. 1A-D). It is noted that the terms "substrate" and "wafer" may be used interchangeably throughout the discussion, and are intended to encompass substrates in general.

Figure 1B:
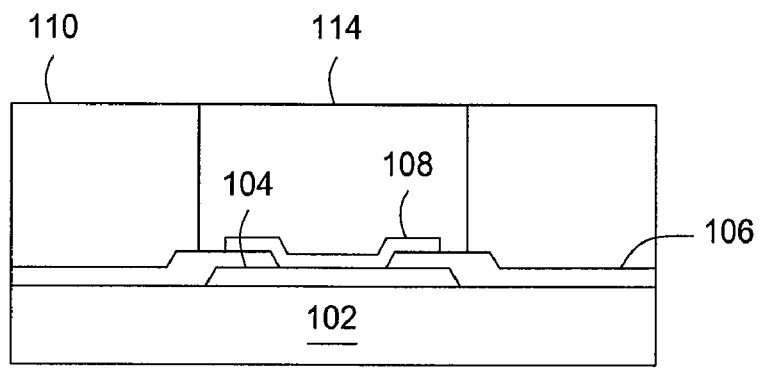
Figure 1C:
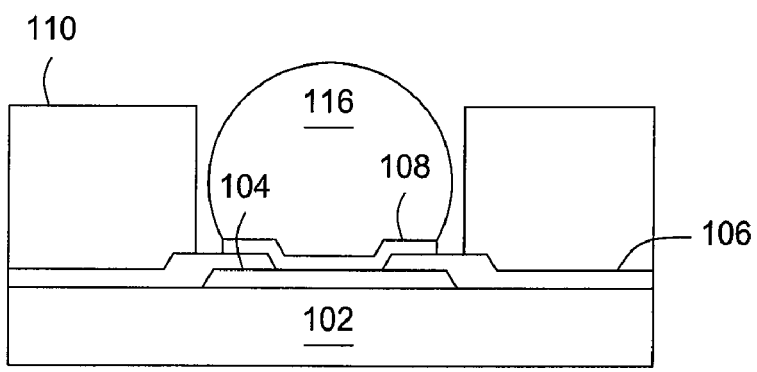
Figure 1D:
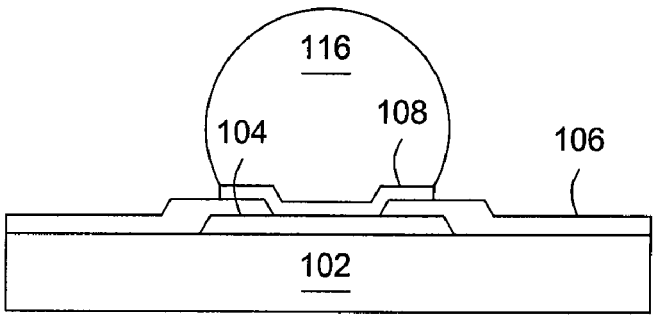
Figure 2:
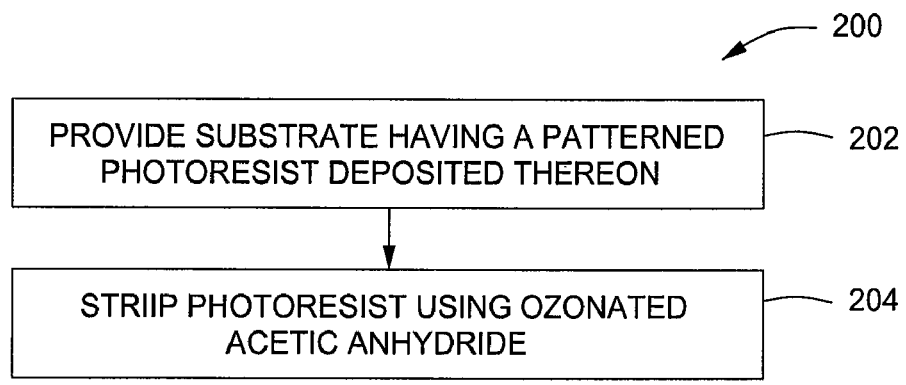
FIG. 2 is a flow chart illustrating a method for stripping a photoresist from a substrate according to some embodiments of the present invention.
Figure 3:
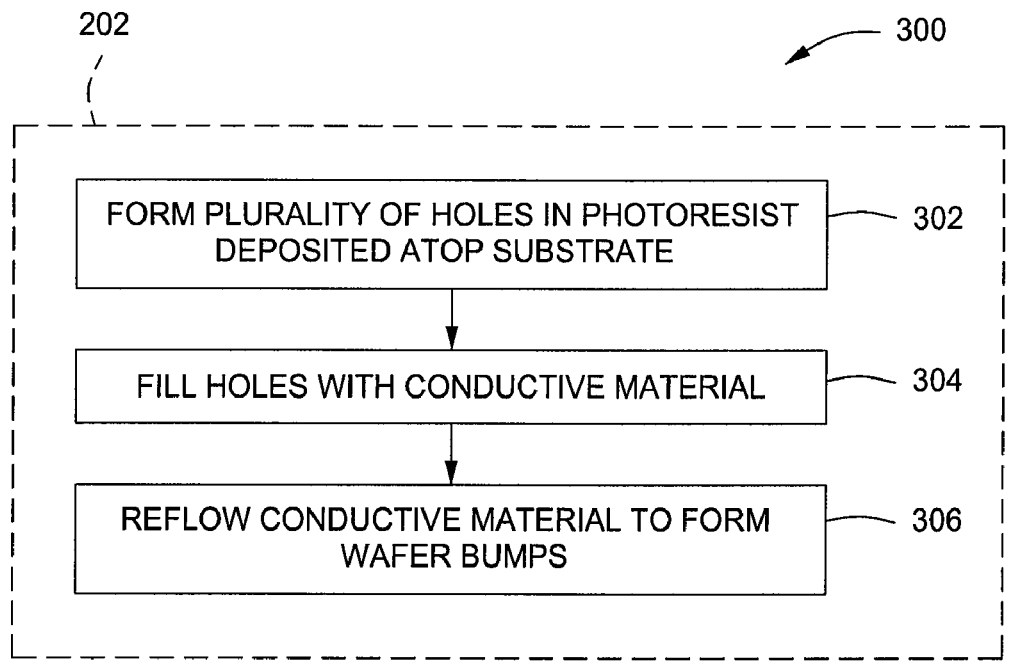
FIG. 3 is a flow chart illustrating a method for forming a wafer bump according to some embodiments of the present invention.
Figure 4:
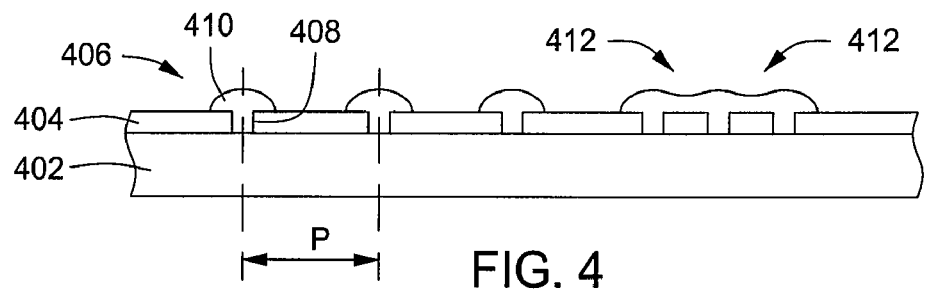
FIG. 4 depicts some illustrative deficiencies of conventional wafer bump formation processes.

FIG. 2 depicts a flow diagram for a process 200 for stripping photoresist suitable for use in connection with connective element formation methods disclosed herein. FIG. 3 depicts a flow diagram for an illustrative process 300 for forming connective elements suitable for use as part of the process 200 described with respect to FIG. 2. The processes 200, 300 of FIGS. 2-3 are described with reference to FIGS. 1A-D, which respectively depict schematic cross sectional views of an illustrative connective element formation process according to some embodiments of the present invention. As used herein, connective elements may refer to wafer bumps, pillars, or other like element utilized for making electrical connections in chip packaging applications, such as flipchip applications.

The process 200 of FIG. 2 begins at 202, where a substrate 102 having a patterned photoresist layer 110 deposited thereon is provided (as depicted in FIG. 1A). The substrate 102 may be any substrate suitable for forming connective elements thereupon (such as part of an IC, or chip, or the like).

For example, FIG. 1A shows a partially formed chip 100, including a wafer, or substrate 102, a conductive pad 104, a passivation layer 106, a conductive layer 108, and a photoresist layer 110. A plurality of holes (such as hole 112) may be formed in the photoresist layer 110 corresponding to the locations where the connective elements are to be formed. It is contemplated that other wafers or substrates having other combinations of layers may be suitably provided as well.

The substrate 102 may be any suitable substrate, such as a semiconductor substrate (e.g., silicon or the like) and may have other layers or features formed or partially formed thereon. The conductive pad 104 is disposed above the substrate 102 and is configured to provide input/output connections to the underlying substrate 102. The conductive pad 104 may comprise suitable conductive materials, such as aluminum, copper, gold, or the like. The locations of the conductive pads 104 define the pitch of the connective elements to be formed on the substrate 102. In some embodiments, the pitch may be less than about 400 micrometers, or in some embodiments, between about 40 to about 400 micrometers. The passivation layer 106 is disposed above the substrate 102 and may overlap the edges of the conductive pad 104.

The conductive layer 108 is sometimes referred to in wafer bump formation processes as an under bump metallization layer, or UMB layer. The conductive layer 108 may be disposed at least atop the conductive pad 104 and may comprise one or more layers of conductive materials. In some embodiments, the conductive layer 108 can be any metallic layer formed of copper, gold, palladium, titanium, chromium, alloys thereof, and the like, or combinations of the above. In some embodiments, the conductive layer 108 can be a seed layer, such as a copper seed layer. In some embodiments, the conductive layer 108 can be a multi-layer comprising a layer of copper (Cu) formed atop a layer of titanium (Ti) formed atop a layer of titanium nitride (TiN). In some embodiments, the conductive layer 108 can be a multi-layer comprising a layer of copper (Cu) formed atop a layer of nickel (Ni) formed atop a layer of titanium (Ti). The above examples are provided for illustration only and may be varied for specific applications as desired.

A layer of masking material, such as a photoresist, may be deposited upon the underlying structure comprising the conductive layer 108, the passivation layer 106 and the conductive pad 104 to create the photoresist layer 110. The masking material of the photoresist layer 110 may be any suitable photoresist. In some embodiments, the photoresist layer 110 may be a negative photoresist. In some embodiments, the photoresist layer 110 may comprise an organic material, such as a polymer, for example, cross linked polymers including epoxy based compounds, among various others. For example, in some embodiments, the photoresist layer 110 may include SU-8 available from MicroChem Corporation, or negative photoresist laminates available from DuPont, Asahi, and Hitachi, amongst other manufacturers.

The photoresist layer 110 may be deposited by any suitable process, such as by spin coating or lamination. In embodiments where the photoresist layer 110 is a negative photoresist, the photoresist layer 110 can be deposited to a greater thickness than when a positive photoresist is used. For example, in some embodiments, the photoresist layer 110 may be deposited to a thickness of between about 50-100 micrometers (e.g., for some laminates) or up to about 200 micrometers (e.g., for some spin on coatings), although other thicknesses may also be utilized. In addition, the negative photoresist facilitates subsequent processing such as providing a better resistance to plating as compared to positive photoresist materials, and facilitating reflow of connective elements, such as wafer bumps, with the resist in place.

Alternatively, in some embodiments, the photoresist layer 110 may also be a positive photoresist, such as a Novolak spin on positive photoresist or any other positive photoresist. In some embodiments, a photoresist layer 110 comprising a positive photoresist may be deposited to a thickness of up to about 25 micrometers.

The photoresist layer 110 may then be patterned (e.g., exposed and developed) to form the plurality of holes 112 (one hole 112 shown in the Figures for simplicity) in locations corresponding to locations where wafer bumps are to be formed (e.g., aligned with the conductive pads 104). The holes 112 may be formed to any suitable diameter for a desired application to facilitate a desired pitch between holes 112, to accommodate a desired volume of conductive material within the holes 112 during further processing, and/or the like. In some embodiments, the holes 112 may be formed to a diameter of about 50 micrometers, or in some embodiments, less than about 50 micrometers, or in some embodiments, between about 20 to about 50 micrometers.

The chip 100 depicted in FIG. 1A and described above is also suitable for use in a wafer bump formation process, such as process 300 depicted in FIG. 3. For example, the process 300 of FIG. 3 begins at 302 where a plurality of holes 112 are formed in a photoresist layer 110 deposited atop a substrate 102.

Next, at 304, the holes 112 may be filled with a conductive material 114 (as depicted in FIG. 1B). The conductive material 114 may comprise a solder, copper, aluminum, or other malleable metal, and may be deposited in any suitable fashion. For example, in some embodiments, the holes 112 may be filled with a solder in the form of a paste, and, in some embodiments, an electrophoretic paste. The solder may be a leaded or lead-free solder, such as, for example, tin/lead (Sn/Pb) or lead/tin (Pb/Sn), tin/silver (Sn/Ag), tin/silver/copper (Sn/Ag/Cu), tin/silver/bismuth (Sn/Ag/Bi), and the like.

At 306, after the holes 112 have been filled with the conductive material 114, the conductive material 114 may be reflowed to transform the column of conductive material into rounded wafer bumps 116 (as depicted in FIG. 1C). The conductive material 114 may generally be reflowed by elevating the temperature of the conductive material to a temperature above the melting point of the conductive material to allow the conductive material to flow. After cooling, the conductive material 114, still constrained within the holes 112 by the photoresist layer 110, forms a rounded bump 116 above the conductive pad 104 (and conductive layer 108). In some embodiments, especially when a negative photoresist is used, control over the height of the photoresist layer 110 and/or of the diameter of the holes 112 facilitates forming wafer bumps 116 having very little height variation. In addition, control over the volume of the holes 112 formed in the photoresist layer 110 facilitates greater flexibility in choice of solder to be utilized to form the wafer bumps as compared to conventional plating methods and further reduces process costs by eliminating the need for expensive special equipment (such as steppers or the like) to perform the process.

After the reflow of the conductive material 114 to form the wafer bumps 116, the process 300 ends. Upon completion of the process 300, further processing of the chip 100 may be performed, for example as described below with respect to FIG. 2. The process 300 is merely an illustrative embodiment of one of many wafer bump formation processes within the scope of the invention and in not intended to be limiting thereof.

Returning to FIG. 2, further processing of the chip 100 may be performed, such as at 204, where the photoresist layer 110 may be stripped from the chip 100 using a stripping solution comprising, for example, ozonated acetic anhydride (as depicted in FIG. 1D). To strip, or remove, the photoresist layer 110 from the chip 100, the photoresist layer 110 may be treated with a stripping solution (not shown). The stripping solution strips the photoresist layer 110 from the substrate 102, leaving the wafer bumps 116 formed on the chip 100. In some embodiments, the stripping solution may comprise ozone in a solvent comprising acetic anhydride (for example, ozonated acetic anhydride). The use of a stripping solution comprising ozone and acetic acid facilitates stripping the photoresist with little corrosion to any underlying or exposed metal layers or features on the substrate 102.

In some embodiments, the acetic anhydride may be mixed with one or more organic solvents that are less corrosive than acetic anhydride, thereby facilitating reducing the overall corrosiveness and/or volatility of the stripping solution. In some embodiments, the organic solvent(s) are non-reactive with ozone and exhibit a volatility less than about 30% higher than the volatility of acetic anhydride. For example, suitable solvents may include solvents that are non-corrosive to metals, that have little or no reactivity with ozone, that exhibit very limited reactivity with anhydrides, that are soluble in acetic anhydride, and/or that are liquid at room temperature when mixed with the anhydride may be utilized. Examples of such solvents include (for example and not by way of limitation) ethylene carbonate, propylene carbonate, and ethylene glycol diacetate.

Ethylene carbonate is a colorless, odorless solid with a flashpoint of 143.7° C. and a freezing point of 36.4° C. In its pure state, ethylene carbonate is a solid at room temperature. Ethylene carbonate is non-reactive to ozone, non-corrosive to metals, and is miscible in acetic anhydride.

Like ethylene carbonate, propylene carbonate is odorless and colorless. Propylene carbonate is a liquid at room temperature. The disadvantage of propylene carbonate is that it is less soluble in water than ethylene carbonate, and thus it is more difficult to rinse residual propylene carbonate off a stripped substrate surface.

Like ethylene carbonate and propylene carbonate, ethylene glycol diacetate is colorless and low in odor. Ethylene glycol diacetate is a liquid at room temperature.

The solubility of ozone in ethylene carbonate or propylene carbonate is considerably less than the solubility of ozone in acetic anhydride (about 40 ppm ozone in ethylene carbonate, as opposed to roughly 500 ppm ozone in acetic anhydride, at 20° C). Because of this decrease in ozone solubility, addition of a carbonate to the stripping solution would be used only when the substrate from which the photoresist is being stripped is particularly sensitive to corrosion by the stripping solution.

To provide an acceptable photoresist removal rate and to maximize corrosion protection, a balance may be provided between the concentration of the acetic anhydride and the concentration of a co-solvent used in the stripping solution. Typically, a carbonate co-solvent containing from 2 to 4 carbons is added in an amount so that the solvent comprises between about 10 and about 90 volume % of this co-solvent; more typically, the carbonate comprises between about 20 and about 70 volume % of the solvent; and often the carbonate comprises between about 30 and about 40 volume %, of the solvent.

The present method of stripping a photoresist can be performed in a simple atmospheric pressure exhausted environment, since a solvent comprising anhydride, alone or in combination with a co-solvent of the kind described above, is not particularly volatile or offensive in odor at temperatures of about 40° C. or lower. Due to the relatively low volatility of acetic anhydride and the co-solvents described herein, the ozonated stripping solution can be sprayed without excessive evaporation, and in most instances can be applied at room temperature, which is typically far below the flammability point of acetic anhydride.

In some embodiments, the stripped substrate may be rinsed with deionized water or ozonated deionized water to facilitate removing any residual stripping solution, as the acetic anhydride will be converted to acetic acid, which is completely miscible with water. In some embodiments, the ozonated deionized water may be used when there is no corrosion problem on the surface of the substrate (e.g., no exposed materials that may be undesirably oxidized by the ozone). The ozonated deionized water is helpful in stripping any residual photoresist on the substrate surface which contains single carbon-to-carbon bonds.

For example, in some embodiments, a substrate surface may be sprayed with a stripping solution comprising liquid ozonated acetic anhydride to remove photoresist from the substrate surface. A second spraying with a liquid ozonated deionized water may be performed to remove any remaining photoresist and/or to rinse off the ozonated stripping solution. A deionized water spray may be used to remove any residue of photoresist and/or stripping solution remaining from the first rinse. Although described herein as applied via spraying a liquid, other methods of applying the stripping solution are contemplated as within the scope of the present invention.

For example, in some embodiments, the stripping solvent may be applied to the substrate surface as a vapor (rather than as a liquid). In the case of vapor application, a pure acetic anhydride/ozone stripping solution (as opposed to use of a co-solvent) may be provided to facilitate simplified recycling of the stripping solution. Use of a combination of ingredients typically causes the vapor concentration to be different than the liquid concentration. Typically, the volatilizing temperature of the solvent is within a range of about 20° C. to about 150° C. The solvent vapor is brought into contact with the substrate to be stripped of photoresist. The solvent vapor may then be condensed on the substrate surface, leaving a layer of condensed stripping solvent on the substrate surface, followed by contacting the condensed layer with ozone gas. The ozone dissolves into the solvent to form a condensed layer of ozonated acetic anhydride-comprising stripping solution that will remove the photoresist.

In some embodiments, ozone gas may be used as a carrier gas to bring vaporized acetic anhydride-comprising solvent to the workpiece surface. In this instance, the solvent is more easily a combination of ingredients, as long as these ingredients can be entrained in the ozone carrier gas, to provide an ozonated stripping solution at the substrate surface.

For example, in some embodiments, the photoresist layer 110 may be stripped using a stripping solution comprising ozone in a solvent, wherein the solvent comprises acetic anhydride. The concentration of ozone may range from between about 50 parts per million (ppm) to about 600 ppm. The solvent may further comprise acetic anhydride in combination with a co-solvent which is miscible with and essentially does not react with the acetic anhydride, such as a carbonate containing from 2 to 4 carbons, ethylene glycol diacetate, combinations thereof, or the like. In some embodiments, the carbonate can be selected from the group consisting of ethylene carbonate, propylene carbonate, and combinations thereof. The co-solvent may comprise from about 20% by volume to about 80% by volume of the solvent in the stripping solution. According to some embodiments, the co-solvent may contain a carbonate and ethylene glycol diacetate, wherein a volumetric ratio of the carbonate to the ethylene glycol diacetate ranges from about 1:1 to about 3:1. Other variations in composition are possible for constituents of the co-solvent. Further, according to some embodiments, the solvent may comprise about 20% by volume acetic anhydride, about 40% by volume ethylene carbonate, and about 40% by volume ethylene glycol diacetate. Other variations are possible in the composition of constituents of the solvent. The temperature at which the photoresist layer 110 is stripped from the substrate may range from about 15 degrees Celsius. to about 80 degrees Celsius.

Thus, methods for forming connective elements for chip packaging applications have been provided herein. The inventive methods utilize a stripping solution that enables the use of thicker photoresist materials, thereby facilitating the formation of connective elements having a tighter pitch and greater flexibility in the selection of materials to form the connective elements. The inventive method simplifies fabrication by reducing steps and eliminating certain expensive machinery components from the process flow. Moreover, the stripping solution of the present invention is less expensive, has a greater lifetime, and is less reactive to metals than conventional solvents utilized to strip photoresist materials in conventional connective element formation processes and the disposal thereof is currently not regulated. In addition, the stripping solution of the present invention may be applied at room temperature and quickly rinsed with deionized water. Embodiments of the present invention facilitate stripping negative photoresist materials with little residue and/or limited metal corrosion.

While the foregoing is directed to some embodiments of the present invention, other and further embodiments of the invention may be devised without departing from the basic scope thereof, and the scope thereof is determined by the claims that follow.

The invention claimed is:

1. A method of forming connective elements on an integrated circuit for flipchip packaging, comprising:
   providing a resist layer on the integrated circuit;
   forming a plurality of holes through the resist layer;
   filling the plurality of holes with conductive material to form connective elements; and
   stripping at least a portion of the resist layer using a stripping solution containing acetic anhydride and ozone to expose the connective elements.

2. The method of claim 1, wherein the resist is a negative photo-resist.

3. The method of claim 2, wherein the negative photoresist comprises an organic material.

4. The method of claim 1, wherein the connective elements have a pitch of less than about 400 micrometers.

5. The method of claim 1, wherein the resist is stripped at a temperature between about 15 to about 80 degrees Celsius.

6. The method of claim 1, wherein the concentration of ozone in the stripping solution ranges between about 50 ppm and about 600 ppm.

7. The method of claim 1, wherein the stripping solution further comprises at least one co-solvent which is miscible with and essentially does not react with the acetic anhydride.

8. The method of claim 7, wherein the co-solvent comprises at least one of a carbonate containing from 2 to 4 carbons or ethylene glycol diacetate.

9. The method of claim 1, wherein the connective elements comprise wafer bumps.

10. The method of claim 1, wherein the connective elements comprise pillars.

11. The method of claim 1, wherein the conductive material comprises at least one of solder, copper, or aluminum.

12. The method of claim 1, wherein the conductive material is a solder paste.

13. The method of claim 12, wherein the solder paste is an electrophoretic solder paste.

14. The method of claim 1, wherein the connective elements comprise wafer bumps and further comprising:
reflowing the conductive material to form the wafer bumps.

15. The method of claim 1, wherein at least one of the plurality of holes has a diameter of less than about 50 micrometers.

16. The method of claim 1, wherein at least one of the plurality of holes has a diameter of between about 20 and about 50 micrometers.

17. The method of claim 1, wherein the conductive material does not extend beyond the hole in the resist layer.

18. A method of forming connective elements on a substrate, comprising:

providing a substrate having a plurality of connective elements extending therefrom and further having a resist layer disposed on the substrate and partially surrounding the connective elements; and stripping at least a portion of the resist layer using a solution containing acetic anhydride and ozone to expose the connective elements.

19. The method of claim 18, wherein the substrate comprises at least an exposed metal.

20. The method of claim 18, wherein the connective elements comprise at least one of bumps or pillars formed from a conductive material comprising at least one of solder, copper, or aluminum.

* * * * *